United States Patent
Smith et al.

(10) Patent No.: US 6,693,819 B2
(45) Date of Patent: Feb. 17, 2004

(54) HIGH VOLTAGE SWITCH CIRCUITRY

(75) Inventors: Douglas D. Smith, Mesa, AZ (US); Myron Buer, Gilbert, AZ (US); Bassem Radieddine, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 21 days.

(21) Appl. No.: 10/041,296

(22) Filed: Jan. 8, 2002

(65) Prior Publication Data

US 2003/0128576 A1 Jul. 10, 2003

(51) Int. Cl.$^7$ ............................................. G11C 11/00
(52) U.S. Cl. ..................... 365/154; 365/96; 365/182; 365/189.11; 257/530
(58) Field of Search .................... 365/154, 96, 182; 365/189.11; 257/530

(56) References Cited

U.S. PATENT DOCUMENTS

| | | | |
|---|---|---|---|
| 5,278,784 A | 1/1994 | Ishihara et al. ................. 365/96 |
| 5,418,738 A | 5/1995 | Abadeer et al. ............... 365/100 |
| 5,646,438 A | 7/1997 | Frerichs ........................ 257/530 |
| 5,748,025 A | 5/1998 | Ng et al. ........................ 327/333 |
| 5,886,392 A | 3/1999 | Schuegraf ..................... 257/530 |
| 5,898,611 A * | 4/1999 | Yamada ........................ 365/154 |
| 5,949,712 A | 9/1999 | Rao et al. ................... 365/185.07 |
| 5,963,462 A * | 10/1999 | Engh et al. ...................... 365/45 |
| 6,041,008 A * | 3/2000 | Marr .......................... 365/225.7 |
| 6,044,012 A | 3/2000 | Rao et al. ...................... 365/182 |
| 6,087,890 A * | 7/2000 | Kim ............................... 327/256 |
| 6,130,834 A | 10/2000 | Mullarkey et al. ............. 365/96 |
| 6,181,627 B1 | 1/2001 | Casper et al. ............. 365/225.7 |
| 6,188,265 B1 * | 2/2001 | Liu et al. ...................... 327/390 |
| 6,266,269 B1 | 7/2001 | Karp et al. .................... 365/150 |

FOREIGN PATENT DOCUMENTS

| | | |
|---|---|---|
| EP | 0756379 | 1/1997 |
| WO | WO 2002/063689 A1 | 8/2002 |

* cited by examiner

Primary Examiner—David Nelms
Assistant Examiner—Connie C. Yoha
(74) Attorney, Agent, or Firm—McAndrews, Held & Malloy, Ltd.

(57) ABSTRACT

The present invention relates to a high voltage switch used with a one-time programmable memory device and a method of setting a state of a one-time programmable memory device using such a high voltage switch. The memory device includes a plurality of one time programmable memory cells arranged in an array and adapted to be programmed using a high voltage, wherein each of the memory cells includes at least one storage element and two gated fuses connected to the storage element. A high voltage switch is connected to at least one of the memory cells and is adapted to switch in a high voltage.

22 Claims, 9 Drawing Sheets

HIGH VOLTAGE SWITCH CIRCUITRY

CROSS REFERENCE TO RELATED APPLICATIONS

[Not Applicable]

FEDERALLY SPONSORED RESEARCH OR DEVELOPMENT

[Not Applicable]

SEQUENCE LISTING

[Not Applicable]

BACKGROUND OF THE INVENTION

One embodiment of the present invention relates to a memory cell with a gated fuse element. More specifically, one embodiment of the present invention relates to high voltage switch circuitry used to program or set the state of a gated fuse element used with a one-time programmable CMOS memory cell in a memory device.

There are two main types of memory devices used in the field of data storage. The first type is volatile memory that has the information stored in a particular memory device, where the information is lost the instant power is removed. The second type is a non-volatile memory device in which the information is preserved even with the power removed. Of the second type, some designs provide for multiple programming while other designs provide for one-time programming. Typically, the manufacturing techniques used to form such non-volatile memories are quite different from standard logic processes, thereby dramatically increasing the complexity and chip size of such memories.

One-time programmable (alternatively referred to as "OTP") memory cells and devices have numerous applications, specifically long-term applications. For example, OTP memory devices may be used in post package programming to store security codes, keys or identifiers. These codes, keys or identifiers cannot be electrically altered or decoded without destroying the circuitry. Further, such OTP memory devices may be used to make a device unique for a specific application. Alternatively, such memory devices may be used as memory elements in programmable logic and read only memory devices.

Known OTP memory devices use storage elements combined with poly fuses. One disadvantage of poly fuses is that the resistance ratio is fairly close together, having only about one order of magnitude difference in value. In other words, the resistance of the poly fuses before they are blown and the resistance after they are blown is fairly close. Therefore, sensing the difference between a blown and un-blown poly fuse is difficult. Yet another disadvantage of conventional poly fuses is the instability of their programmed state resistance. Specifically, the resistance of programmed poly fuses tends to decrease over time. In the worst case, the programmed poly fuses may actually switch from the programmed state to the unprogrammed state resulting in circuit failure.

Thick oxide gated transistors or fuses (i.e., fuses fabricated according to 0.35 $\mu$m, 0.28 $\mu$m or other thick process technologies) have been used in place of poly fuse memory devices. U.S. Pat. No. 6,044,012, the complete subject matter of which is incorporated herein by reference discloses a technique for rupturing the gate oxide transistor, where the oxide is about 40 to 70 Å thick. It is contemplated that the voltage required to rupture this thick oxide is substantially high and requires using a charge pump circuit. Furthermore, it is believed that the final programmed resistance is in the high kilo ohms range.

One alternative to using thick oxide gated fuses is to use thin-gated oxide transistors or fuses. Commonly assigned application Serial No. 09/739,752, the complete subject matter of which is incorporated herein by reference, discloses the physical current used to rupture, breakdown or blow a gate-ox fuse, where the oxide is about 2.5 nm thick or less (alternatively referred to as "thin oxide transistor or fuse" or "thin gate-ox transistor or fuse"). Such thin gate-ox transistors or fuses integrate both NMOS and PMOS transistors on a silicon substrate. The NMOS transistor consists of a N-type doped polysilicon gate, a channel conduction region, and source/drain regions formed by diffusion of N-type dopant in the silicon substrate. The channel region separates the source from the drain in the lateral direction, whereas a layer of dielectric material that prevents electrical current flow separates the polysilicon gate from the channel. Similarly, the PMOS transistor architecture is the same as the NMOS transistor provided previously but using a P-type dopant.

The dielectric material separating the polysilicon gate from the channel region usually consists of thermally grown oxide material, silicon dioxide ($SiO_2$) for example, where the oxide is about 2.5 nm thick or less. Here the thin oxide leaks very little current, through a mechanism called Fowler-Nordheim tunneling, under voltage stress. When this thin gate-ox transistor or fuse is stressed beyond a critical electrical field (applied voltage divided by the thickness of the oxide) the oxide ruptures, destroying (alternatively referred to as "blowing") the transistor or fuse. If the fuse is connected or coupled to a storage element as part of a memory cell as disclosed in commonly assigned application Ser. No. 10/025,132 (Attorney Ref. No. 13374US01), titled "Memory Cell with Fuse Element", the complete subject matter of which is incorporated herein by reference, blowing the transistor or fuse sets the state or programs the storage element and thus the memory cell.

Generally a high voltage is used to blow one of the fuses to set the state or program the memory cell. It is possible to utilize high voltage devices or a charge pump using a small amount of current to supply the high voltage required to blow the fuse and set the state of the memory cell. However, such a high voltage might affect or damage parts of the memory cells in the memory devices. It is therefore advantageous to set the state of the memory cell in the memory device by switching in a high voltage without using such high voltage devices. It is further advantageous to protect specific parts of the memory cell, including parts of the gated fuse or transistor, from the high voltage yet still use such high voltage to blow the fuse and set the state of the memory cell.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Features of the present invention may be found in memory device and method of programming or setting a state of a memory cell in the memory device. In one embodiment, the present invention comprises a memory device having at least one memory cell adapted to store data and a voltage switch device. The voltage switch device is coupled to the memory cell and is adapted to set a state of the memory cell.

In another embodiment, the present invention comprises a memory device including one memory cell adapted to store data and a voltage switch device, where the memory cell includes at least one gated device, a thin gate-ox fuse (having an oxide of about 2.5 nm thick or less) which is adapted to be blown by a high programming voltage switched in by the high voltage switch device.

In yet another embodiment, the present invention relates to a one-time programmable memory device comprising at least two memory cells in an array adapted to be programmed using a high voltage and at least one high voltage switch device connected to at least one of the memory cells and adapted to switch in a high voltage.

In another embodiment, the present invention relates to a one time programmable memory device comprising a plurality of memory cells and at least one high voltage switch. The memory cells are arranged in an array and are adapted to be programmed using a high voltage. Each of the memory cells includes at least one storage element and two gated fuses connected to the storage element. The high voltage switch is connected to at least one of the memory cells and is adapted to switch in the high voltage.

One embodiment of the present invention relates to a method of setting a state of a memory cell having at least one gated fuse using a high voltage switch. The high voltage switch has a voltage ranging between about 0 volts and about 5 volts and the gated fuse is a thin oxide gated fuse.

Other aspects, advantages and novel features of the present invention, as well as details of an illustrated embodiment thereof, will be more fully understood from the following description and drawings, wherein like numerals refer to like parts.

DETAILED DESCRIPTION OF THE INVENTION

The present invention relates to a switch device and method used to program transistors, or gated fuse elements in a memory cell of a memory device. Specifically, this invention relates to a high voltage switch device or circuitry that may be controlled on a per column basis to program one or more OTP memory cell(s) at a time, whether such memory cells are standing alone or arranged in a plurality of rows and columns (alternatively referred to as an "array").

If a high voltage supply is used to provide a high programming voltage to set the state of the gated fuses, using such a high voltage switch device may reduce the current required by such supply. Furthermore, as such high voltage supply is usually an on-chip charge pump, reducing the current requirement may result in a smaller and less expensive charge pump, thus requiring less space on the chip. Furthermore, such high voltage switch devices may switch a high programming voltage into the memory cell without exposing the entire memory cell or the other memory cells in the memory device to such high programming voltage.

In one embodiment of the present invention, the high voltage switch circuitry provides controlled pulses of a high programming voltage to rupture the oxide of at least one gated fuse in a memory cell, thus programming it. A high programming voltage is switched into the cell, creating about a 5 volt difference for example across the gate of the gate-ox fuse, rupturing it.

Generally such high programming voltage is a higher voltage than the transistors or gated fuse normally handle. The high voltage switch device or circuit of the present invention is able to protect the other transistors in the memory device from the high programming voltage, yet still switch the high programming voltage into the memory cell to be programmed. In order to accomplish this, the high voltage switch device must be able to switch a number of different signals, different voltage ranges, different swings and different modes.

Figure 1:
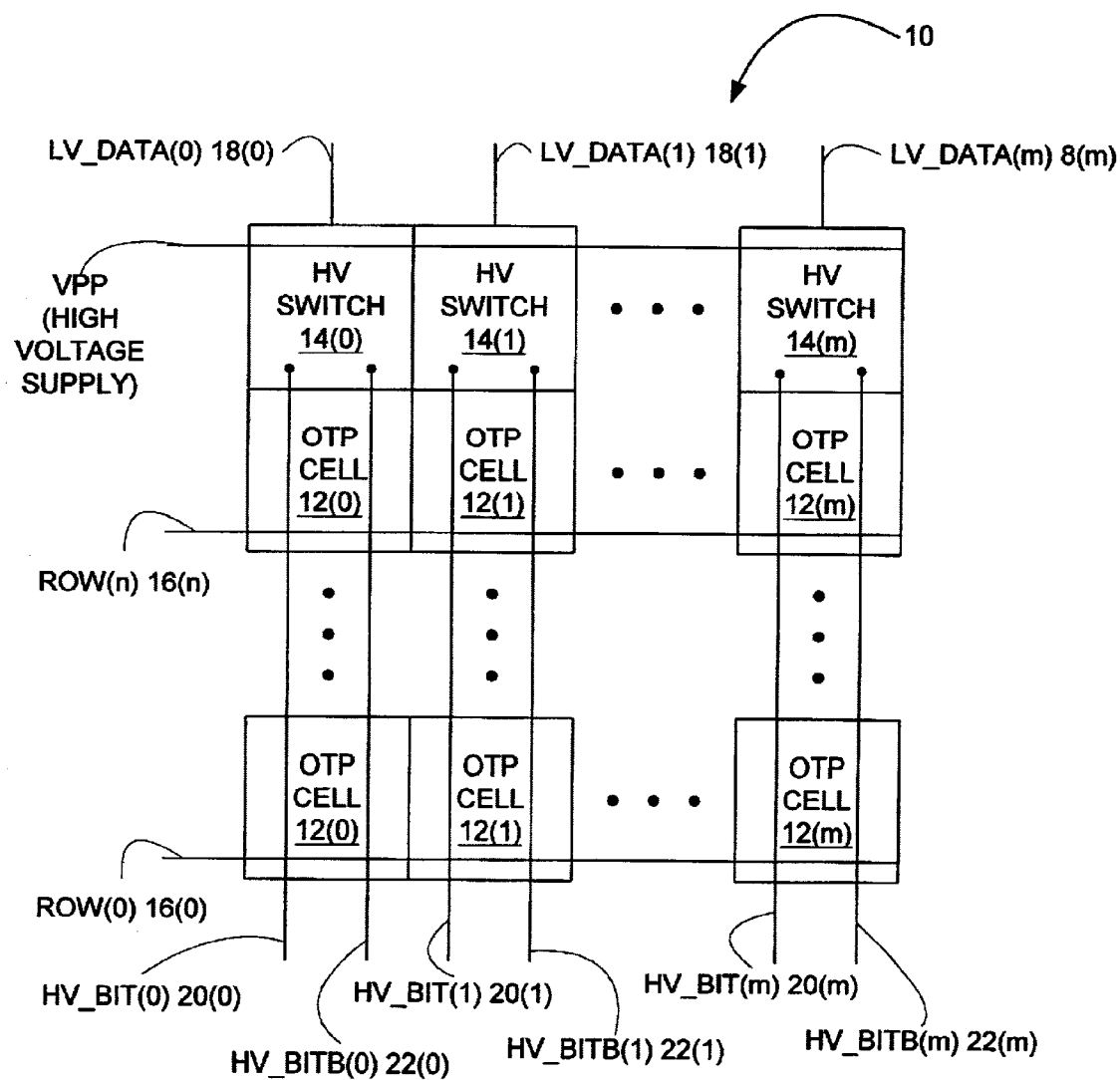
FIG. 1 illustrates a block diagram of a memory device having a plurality of OTP memory cells and high voltage switches in accordance with one embodiment of the present invention.

FIG. 1 illustrates a block diagram of one embodiment of a memory device, generally designated 10, having a plurality of OTP memory cells 12 and high voltage switches 14 in accordance with one embodiment of the present invention. As illustrated, the OTP memory cells 12 are arranged in a plurality of rows 16 and columns 18 forming an array. In this embodiment, the memory device 10 comprises a total of "n" rows and "m" columns, where m may be greater than, equal to or less than n.

At least one high voltage switch 14 is illustrated connected, coupled or otherwise communicating with all the memory cells 12 using one or more high voltage bitlines. In the illustrated embodiment, one high voltage switch 14 sits at the top of each of the columns 18 coupled to all the memory cells 12 in each respective column via high voltage bitlines hv_bit 20 and hv_bitb 22 respectively. It is contemplated that there are a total of m hv_bit and hv_bitb bitline pairs, so that each high voltage switch 14(0) through 14(m) is coupled to each of the memory cells in a single column through a pair of hv_bit 20 and hv_bitb 22 lines. Other arrangements contemplated including having one or more high voltage switches 14 coupled to each of the memory cells 12 via more than two bitline or having memory cells 12 share bitline pairs.

As provided previously, each column of the memory array may have a high voltage switch 14 located at a top thereof (although other arrangements are contemplated) which may provide two differential high voltage signals used for programming the OTP memory cell 12 by setting the state of the gate oxide fuse with a high programming voltage (5.0 volts for example). This switch may be controlled on a per column basis. That is one column may be selected at a time to provide the high voltage, given that only one row is selected. In other words, one single OTP memory cell may be programmed at a time using the high voltage switch device of the present invention.

In one embodiment of the present invention, the high voltage switch circuitry 14 switches a variable high voltage input, ranging between about 2.5 volts and about 5.0 volts and switches it into two differential output signals. The switch 14 uses regular transistors that nominally handles up to 2.5 volts between any two of their four terminals, to build a high voltage switch circuit that may reliably switch up to about 5 volts for example on an output signal. This may be achieved by cascading or stacking such regular transistors in such a way that each and every transistor doesn't see more than the nominal voltage (i.e., about 2.5 volts for example) between any two of its four terminals. Depending on the input control signals or mode, the two output signals may both be grounded, both be pulled up to about 2.5 volts, or one pulled up to about 2.5 volts and the other pulled up to about 5.0 volts (i.e., the high programming voltage).

Figure 2:
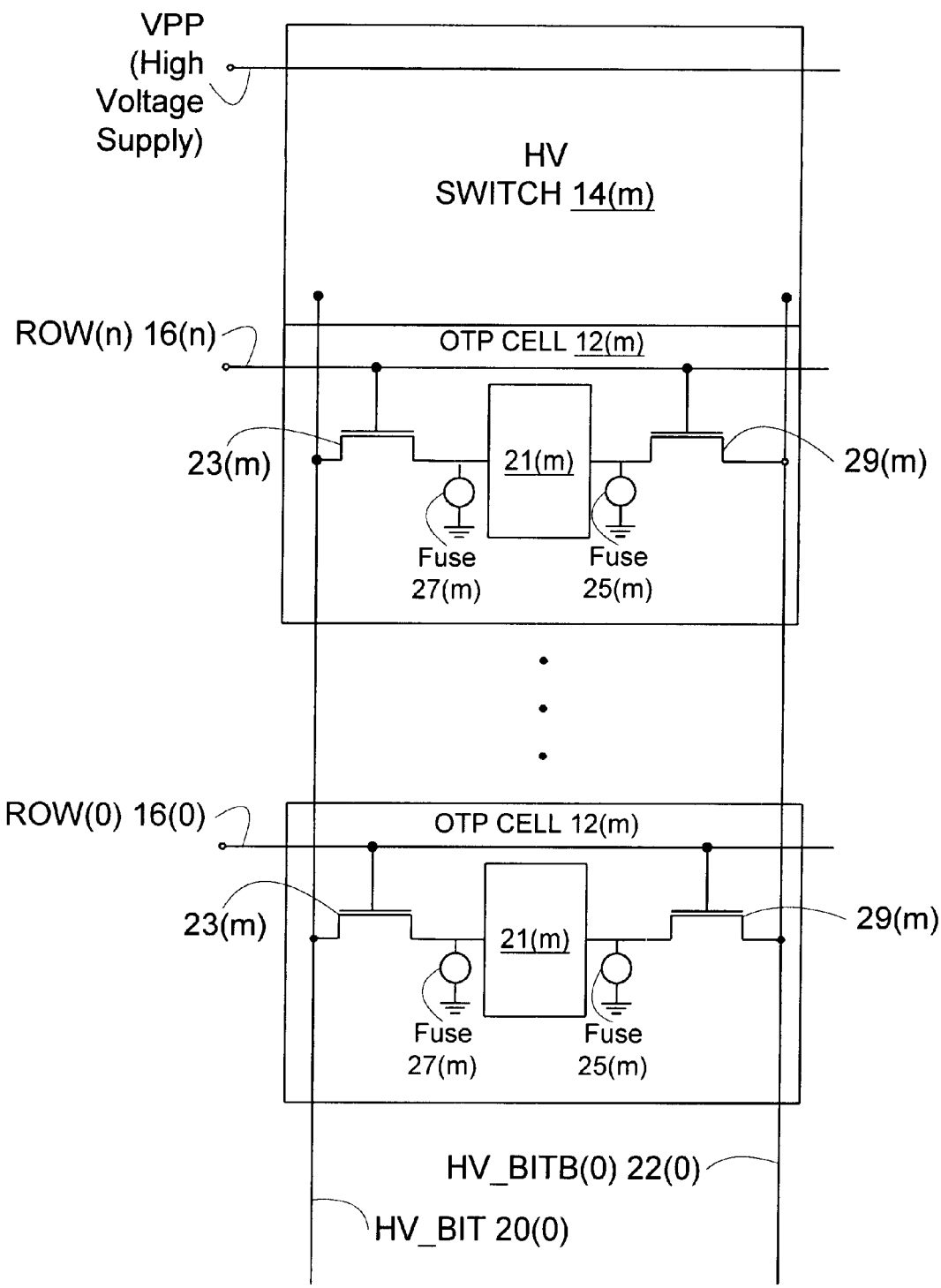
FIG. 2 illustrates a circuit diagram of one embodiment of a memory device having a high voltage switch and a plurality of memory cells including storage elements and gated fuses in accordance with one embodiment of the present invention.

FIG. 2 illustrates a circuit diagram of one embodiment of a memory device similar to the memory device 10 of FIG. 1. In this embodiment one column 18 of the array is illustrated include one HV switch 14 and a plurality of OTP memory cells 12. While only one column (column m for example) is illustrated, more than one column is contemplated as provided previously). In this embodiment each memory cell 12 comprises a storage element 21 and two thin oxide gated fuse 25 and 27 (having an oxide of about 2.5 nm or less for example). Each HV Switch 14 is connected to VPP while each OTP memory cell 12 is connected to one or more ROW lines 16. Furthermore, each of the OTP memory cells 12 is connected to hv_bit 20 and hv_bit 22. In one embodiment, the OTP memory cells 12 are connected to hv_bit 20 and hv_bit 22 through NFet transistors 23 and 29 respectively.

Programming or setting the state of the memory cell comprises selecting one memory cell 12 (alternatively referred to as a "selected cell") from a plurality of cells in an array, using at least one of the plurality of inputs. More specifically, programming the selected cell 12 requires selecting at least one row 16 and at least one column 18 from the plurality of rows and columns in the array. Such selection results in one cell (i.e., the selected cell) differing from all the neighboring cells. For example, the selected cell differs from the one non-selected cell (or two non-selected cells depending on the location of the selected cell) on at least one side of the selected cell, where the non-selected cell(s) is in the selected row but a deselected column. Likewise, the selected cell differs from the non-selected cell above or below the selected cell (or both depending on the location of the selected cell), where the non-selected cell(s) are in a selected column but a deselected row. Thus, in one embodiment of the present invention, the memory device comprises a plurality of memory cells in an array, wherein at least two or more of the cells are in different conditions or modes.

Figure 3:
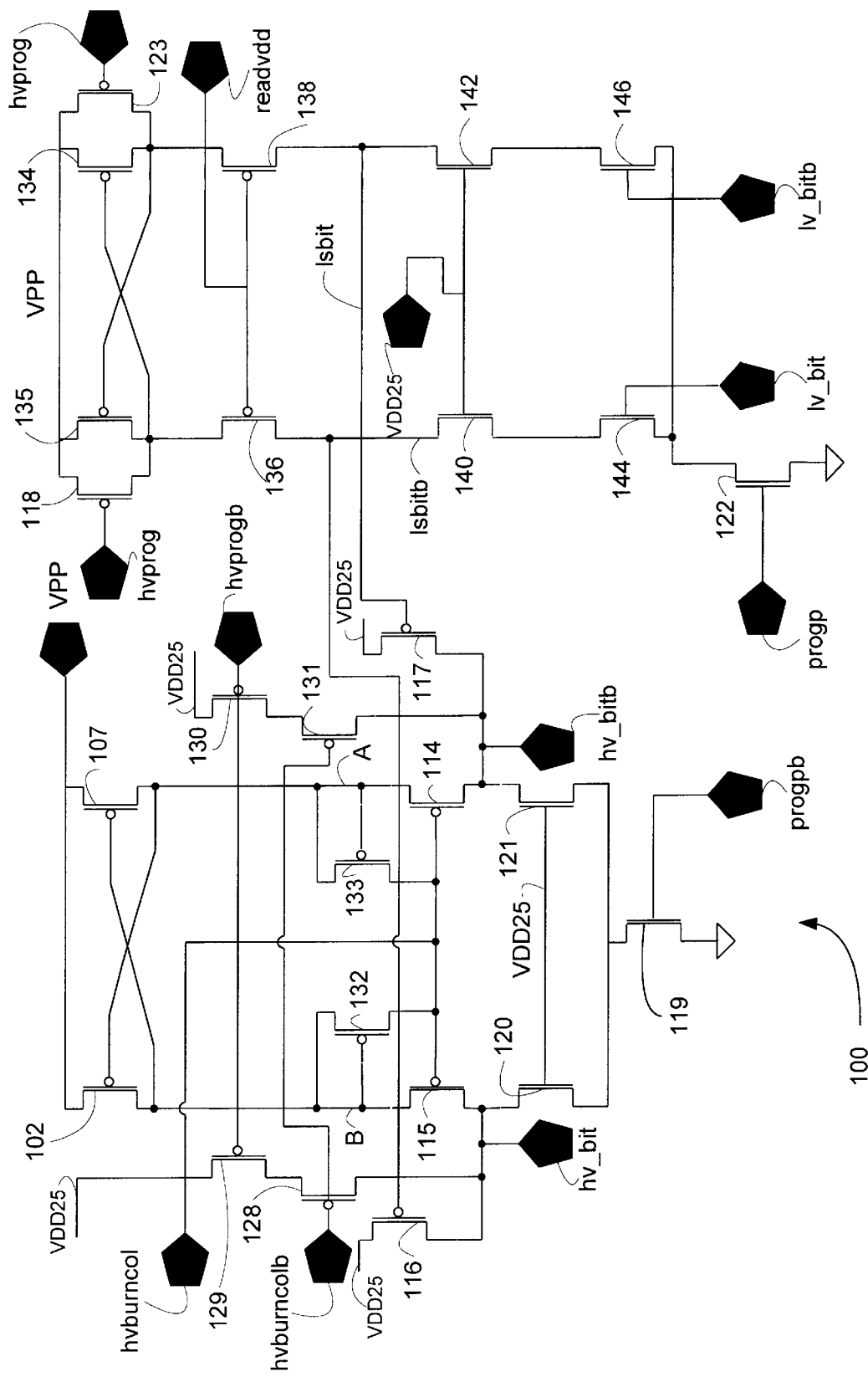
FIG. 3 illustrates a circuit diagram of one embodiment of the high voltage switch device similar to the high voltage switches of FIG. 1 in accordance with one embodiment of the present invention.

FIG. 3 illustrates one embodiment of a high voltage switch device or circuitry 100 (similar to the HV switch 14 illustrated previously) used in one embodiment of the present invention. As illustrated, this embodiment of the high voltage switch device 100 includes a plurality of input and output pins and a plurality of NFet and PFet transistors. A PFet transistor is turned on by a logic 0 at its gate and is adapted to pass or transmit a logic 1. An NFet transistor is turned on by a logic 1 at its gate and is adapted to pass or transmit a logic 0. In one embodiment of the present invention, any voltage above 2.5 volts (the high programming voltage for example) is switched through the PFet transistors. It is contemplated that in one embodiment of the present invention most of the voltage switching takes place through the PFet transistors.

Input pin VPP is a variable high voltage input, which may be supplied by an on-chip pump or external supply and ranges between about 2.5 volts and about 5 volts for example (i.e., in this embodiment VPP is the high programming voltage). Input pin VDD25 is a 2.5 voltage supply connected to the high voltage switch device 100. Input pin VSS represents ground having a voltage of zero. Input pins progp and progpb represent the program and program bar signals respectively, which determine if the switch device is in a programming mode or not. Input pins progb and progpb each range between about 0 volts and about 2.5 volts.

Input pin hvprog and hvprogb represent the high voltage program and high voltage program bar signals respectively, which along with progb and progpb signals determine if the switch device is in a programming mode or not. Input pins hvprog and hvprogb each range between about 0 volts and about VPP for example. Input pins hvburncol and hvburncolb represent the high voltage burn column and high voltage burn column bar signals respectively, which determine if a column is selected or not. In this embodiment, Input signals hvburncol and hvburncolb range between about 2.5 volts and about VPP and about 0 volts and about VPP respectively.

Input signal readvdd represents the readvdd signal that in one embodiment of the present invention ranges between about 0 volts and about 2.5 volts. Input signal readvdd is about 0 volts in read mode and about 2.5 volts in program mode. Input pin Iv_bit represents the low voltage bit signal that ranges between about 0 volts and about 2.5 volts for example. Input pin Iv_bitb represents the low voltage bit bar signal that ranges between about 0 volts and about 2.5 volts for example.

In this embodiment, the outputs of the high voltage switch devices have to swing from about 0 volts to about VPP to set the state of the selected memory cell. Output pin hv_bit represents the high voltage bit signal that ranges between about 0 volts and about VPP for example. Output pin hv_bitb represents the high voltage bit bar signal that ranges between about 0 volts and VPP for example.

In one embodiment of this invention, one or more of the input signals are qualified or affected by one or more other signals. For example, Isbit and Isbitb are qualified by one or more of the other input signals, hvprog for example. The signal hvprog must be high for Isbit or Isbitb to be high. However, for hv_bit or hv_bitb to be set high, the corresponding Iv_bit or Iv_bitb must be set low.

VPP is qualified by hvburncol and hvburncolb for example. When VPP is set low, the selected memory cell is not in a programming mode. However, when VPP is set high and hvburncol is set high the high voltage switch is in a programming mode, but the particular column that the high voltage switch is coupled to is not selected. When VPP is set high and hvburncol is set low (hvburncolb is set high) the high voltage switch is in programming mode and that particular column that the high voltage switch is coupled to is selected. Further, the input signal hvprog must be set high to set Isbit or Isbitb high for example.

As provided previously, one embodiment of the high voltage switch device comprises a plurality of PFet and NFet transistors. In this embodiment, PFet transistors 102 and 107 comprise a first level shift device, PFet transistors 114 and 115 comprise a second level shift device. NFet transistors 120 and 121 comprise a third level shifter device similar to the PFet transistors 114 and 115. In one example, transistors 114 and 115 pass a high voltage from transistors 102 and 107 to bitlines hv_bit and hv_bitb.

In this embodiment, the switch 100 includes two stacks of PFet transistors connected in series. The two stacks of series PFets comprise transistors 129 and 128, and transistors 130 and 131. These two series of PFet transistors act, in one embodiment, as a selection device. For example, these transistors may be set high in a programming mode to protect the non-selected cells in a non-selected column so that the memory cells in that non-selected column are not exposed to the high programming voltage and are not programmed (i.e., blown). These two series of transistors are off when the high voltage switch is connected to a selected column.

In one embodiment, transistors 132 and 133 act as a protection device, effectively protecting Nodes A and B. These transistors prevent Nodes A and B from coupling to ground. That is transistors 132 and 133 prevent these Nodes from going too low (below about 2.5 volts for example) and turning on. If these Nodes are pulled too low, there is nothing connected to these nodes to pull them up. Transistors 132 and 133 protect against coupling nodes A & B below 2.5 volts which would overstress transistors 102 and 107.

FIG. 3 further illustrates that a portion of the illustrated high voltage switch circuit 100 comprises PFets 118, 135, 134, 123, 136 and 138 and NFets 140, 142, 144 and 146. In one embodiment of the present invention, these transistors comprise a level shift device adapted to shift the low voltage data coming in on Iv_bit and Iv_bitb up to a high voltage (about 5 volts for example).

As provided previously, it is contemplated that the high voltage switch, and thus the memory device, may be in one of four modes. In one embodiment, the high voltage switch and memory cell is not in programming mode. This first mode or Mode 1 represents the non-programming mode. In this mode, the bit lines are isolated or protected from the high voltage. In Mode 1, progp is set low (about 0V for example), and VPP is set at about 2.5 volts for example. Both outputs hv_bit 20 and hv_bitb 22 are pulled down to ground through transistors 119, 120, and 121. In this Mode 1 transistors 114, 115, 116, 117, 128, 129, 130 and 131 are all off.

The second mode represents a programming mode, however a particular cell is in a selected row but a deselected column. This means the selected cell does not pass the programming voltage to hv_bit or hv_bitb but stands off such the high voltage.

In this mode, progp is set high (about 2.5 volts for example), VPP is set at about 5 volts for example, and hvburncol is set at about 5 volts for example. Outputs hv_bit and hv_bitb are pulled to about 2.5 volts through transistors 128, 129, 130 and 131. In this mode transistors 114, 115, 116, 117, 120, and 121 are all off. This mode is used during programming when a row is selected but the column is not, so both output signals (hv_bit and hv_bitb) need to be set at about 2.5 volts for example in order to protect the non-selected cell from high programming voltage used to burn the gate oxide fuses of the selected OTP memory cell in that row.

Modes 3 and 4 represent the programming mode when a column is selected for a selected row. Mode 3 represents when the high voltage is passed to hv_bit 20 to set the state of the gated fuse connected thereto. This mode represents a programming mode when both a row and a column are selected; (i.e., the OTP memory cell is selected and one of its two fuses is to be blown). Since the OTP memory cell is programmed differentially, then one output signal (hv_bit) is set at a high voltage (about 5 volts for example ) and the other output signal (hv_bitb) is set at a low voltage (about 2.5 volts for example) which is determined according to Iv_bit and Iv_bitb input signals.

In this mode, progp is set high (about 2.5 volts for example), VPP is at about 5 volts for example, hvburncol is set at about 2.5 volts for example, Iv_bit is set low, and Iv_bitb is set high. Output hv_bit is pulled to about 5 volts for example through transistors 115 and 102, while output hv_bitb is pulled to 2.5 volts for example through transistor 117. In this mode, transistors 116, 128, 129, 114, 107, 130, 131, 120 and 121 are all turned off.

Mode 4 represents another programming mode when a column is selected for a selected row. In this mode, the OTP memory cell is again selected by the row and the column and the states of one of its fuses is to be set. Again, as the OTP memory cell is programmed differentially, then one output signal is at low voltage (about 2.5 volts for example) and the other output signal is at high voltage (about 5 volts for example) which is determined according to Iv_bit and Iv_bitb input signals. However, here the fuse connected to hv_bitb is to be blown, so that the high programming voltage must be passed to this output signal.

In this mode, progp is again set high (about 2.5 volts for example), VPP is set at about 5 volts for example, hvburncol is set at about 2.5 volts for example, Iv_bit is set high, and Iv_bitb is set low. Output hv_bit is pulled to about 2.5 volts through transistor 116 while output hv_bitb is pulled to about 5 volts through transistors 114 and 107. In this mode, transitors 115, 102, 128, 129, 117, 130, 131, 120 and 121 are all turned off.

Figure 4:
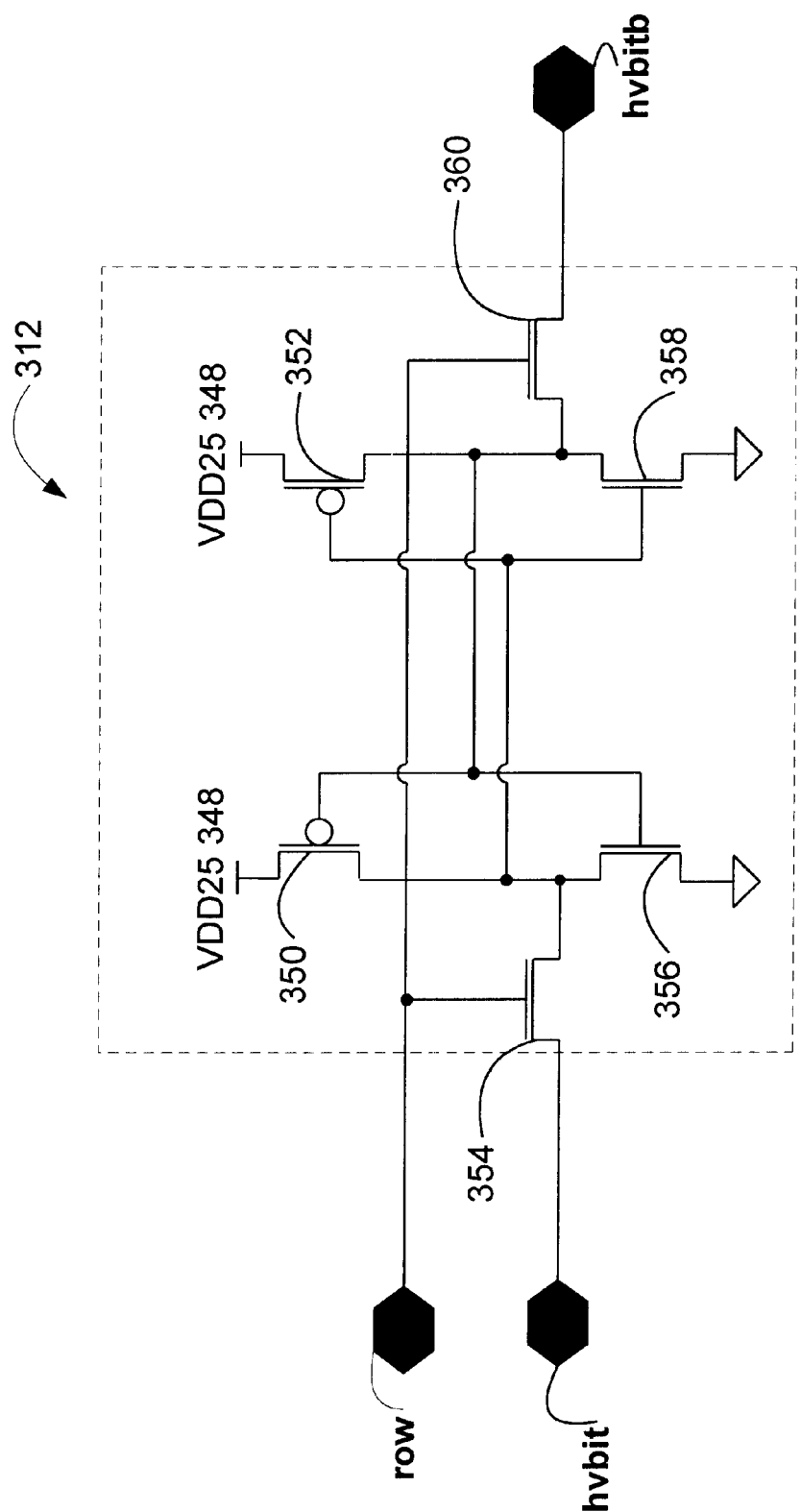
FIG. 4 illustrates a circuit diagram of one embodiment of a 6T storage element similar to that storage element illustrated in FIG. 2.

Referring to FIG. 4, one embodiment of storage element generally designated 312 (similar to the storage element 21 discussed previously) is illustrated. In one example, the storage element 312 is a 6T CMOS SRAM storage element comprising two PFet transistors 350 and 352 and four NFet transistors 354, 356, 358 and 360. In the embodiment, the storage element is coupled or connected to row, hv_bit and hv_bitb.

The storage element 312 is either in a low or high stored memory state. If a logic 0 is stored (i.e., storage element 312 is in a low stored state) recording new and opposite information stores a logic 1 on the storage element (i.e., a high stored state). If logic 1 is recorded on storage element 312 (i.e., storage element 312 is in a high stored state) recording new and opposite information records logic 0 (i.e., changes the storage element to a low stored state).

Figure 5:
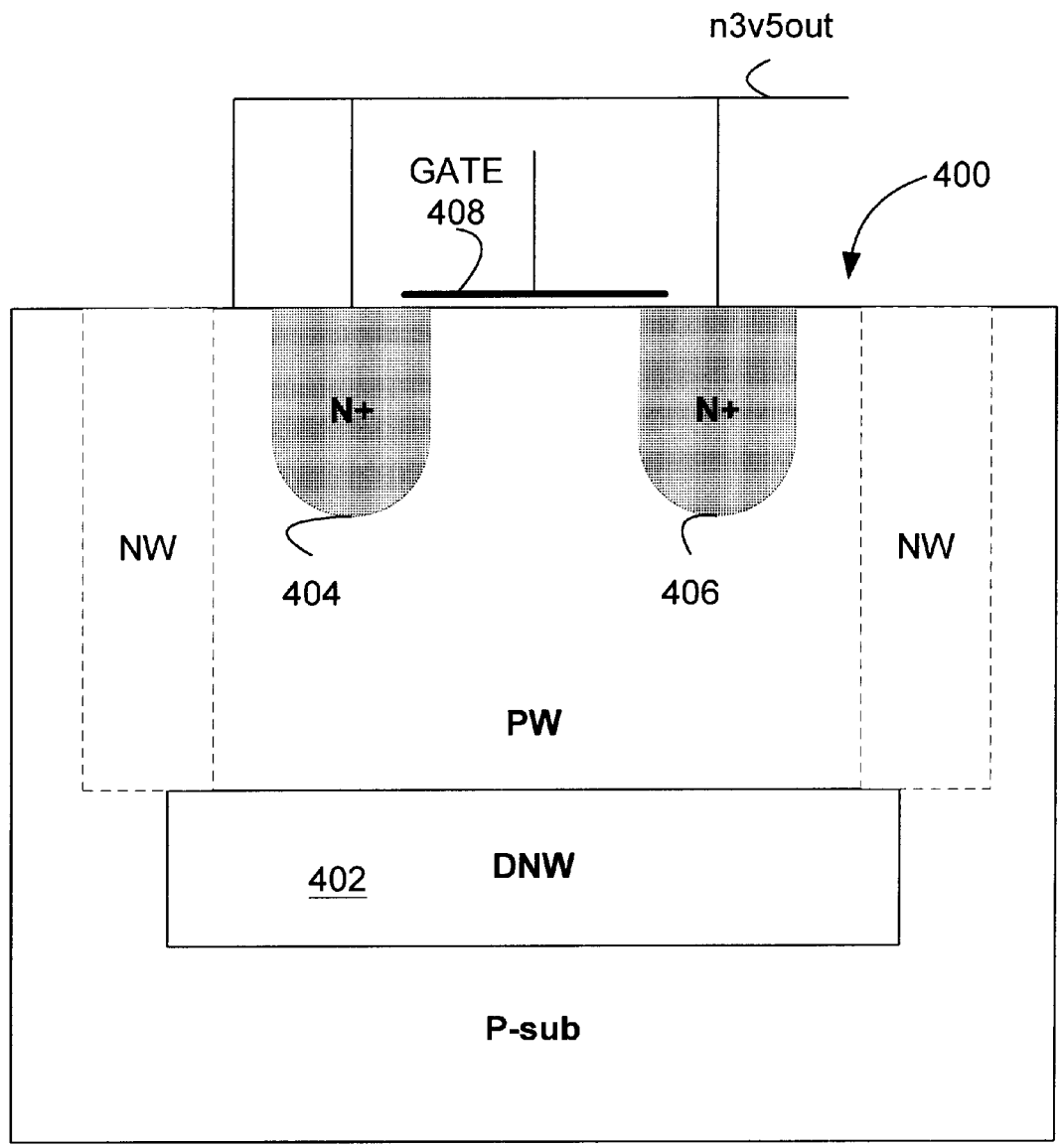
FIG. 5 illustrates one embodiment of a deep N-well MOSFET gate-ox fuse similar to the gated fuses illustrated in FIG. 2.

FIG. 5 illustrates one embodiment of a gated fuse element 400 (similar to the gated fuses 25 and 27 provided previously). In this embodiment fuse element 400 is a deep N-well MOSFET gate-ox fuse 400 having an oxide about 2.5 nm thick or less used with a storage element according to one embodiment of the present invention. The fuse 400 includes a deep N-well 402. N3v5out is illustrated coupling source 404 and drain 406. The gate 408 is coupled to hv_bit and hv_bitb (not shown).

The advantage of the deep N-well 402 is that it isolates the memory cell, allowing biasing the well, source and drain to −3.5 volts. During a write operation the high programming voltage is applied to the gate through the vload, thus effectively creating less than about a 6 volt voltage difference across the gate 408 oxide to rupture it. For example, in one embodiment about a 5 volt voltage difference is created across the gate oxide rupturing it as provided previously.

When the gate oxide is blown, a conductive path is formed between the gate electrode and the source/drain regions of the gate-ox fuse transistor. This resistance, under controlled electrical pulses, will be in the hundreds of ohms range or less, which is 4 orders of magnitude lower than the resistance prior to programming. To apply the high programming voltage across the gate oxide of the gate-ox fuse transistor, the drain and source regions of the anti-fuse transistor are connected to ground, and a high programming voltage is applied to the gate of the fuse transistor as provided previously.

Figure 6:
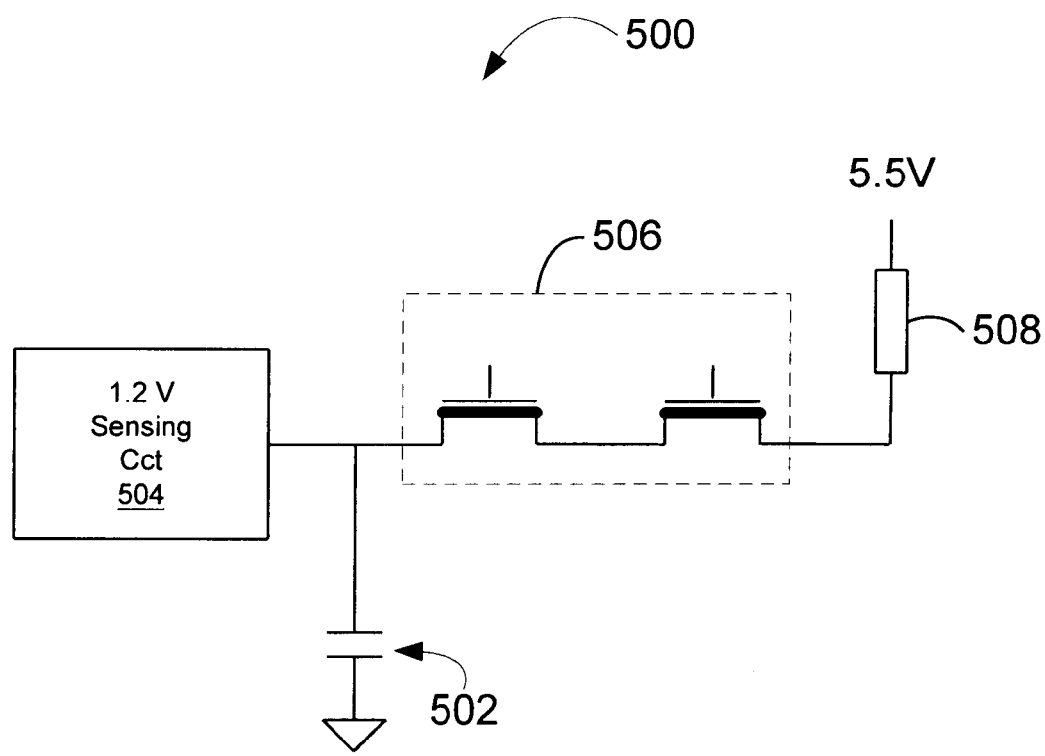
FIG. 6 illustrates another embodiment of a gate-ox fuse similar to the gated fuses illustrated in FIG. 5.

FIG. 6 illustrates another embodiment of fuse element 500 similar to fuse elements 25, 27 and 400 provided previously. In this embodiment, the gate ox-fuse has an oxide about 2.5 nm thick or less in which a deep N-well transistor is not used. The transistor's gate (shown as capacitor 502) is tied to a 1.2 volt sensing circuit 504 and a 5 volt tolerant switch 506. The 5 volt tolerant switch 506 is constructed from Input/Output MOS devices having a thicker gate oxide.

Figure 7:
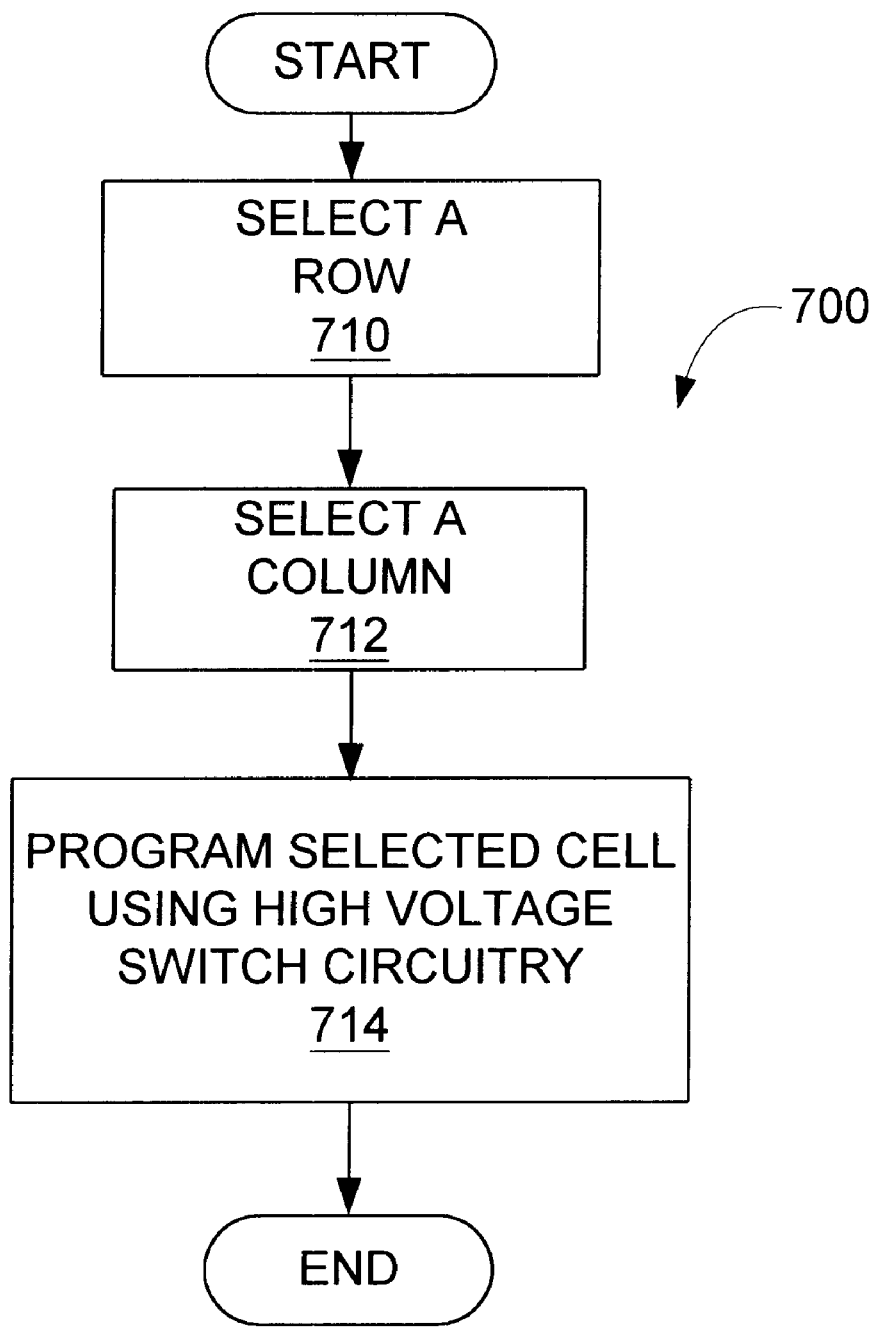
FIG. 7 illustrates a high level flow chart depicting one method of setting a slate of the gated fuses in a memory cell using high voltage switch device.

As provided previously, one embodiment of the present invention comprises programming or blowing any fuses of a memory cell in a memory device using a high voltage switch circuitry. FIG. 7 illustrates a high level flow chart depicting one method for blowing the gated fuse, therefore setting the state or programming the memory cell in a memory device in accordance with one embodiment of the present invention. This method, generally designated 700, includes selecting one row from a plurality of rows and selecting one column from a plurality of columns as illustrated by block 710 and 712 respectively. While in this embodiment a plurality of rows and a plurality of columns are described, it is contemplated that the memory device may only include one row and a plurality of columns, one column and a plurality of rows, or one row and one column.

The selected memory cell in the selected column and the selected row is programming as illustrated by block 714. In one embodiment, the selected memory cell is programmed (i.e., the fuses are blown) using a high voltage switch device in accordance with one embodiment of the present invention.

Figure 8A:
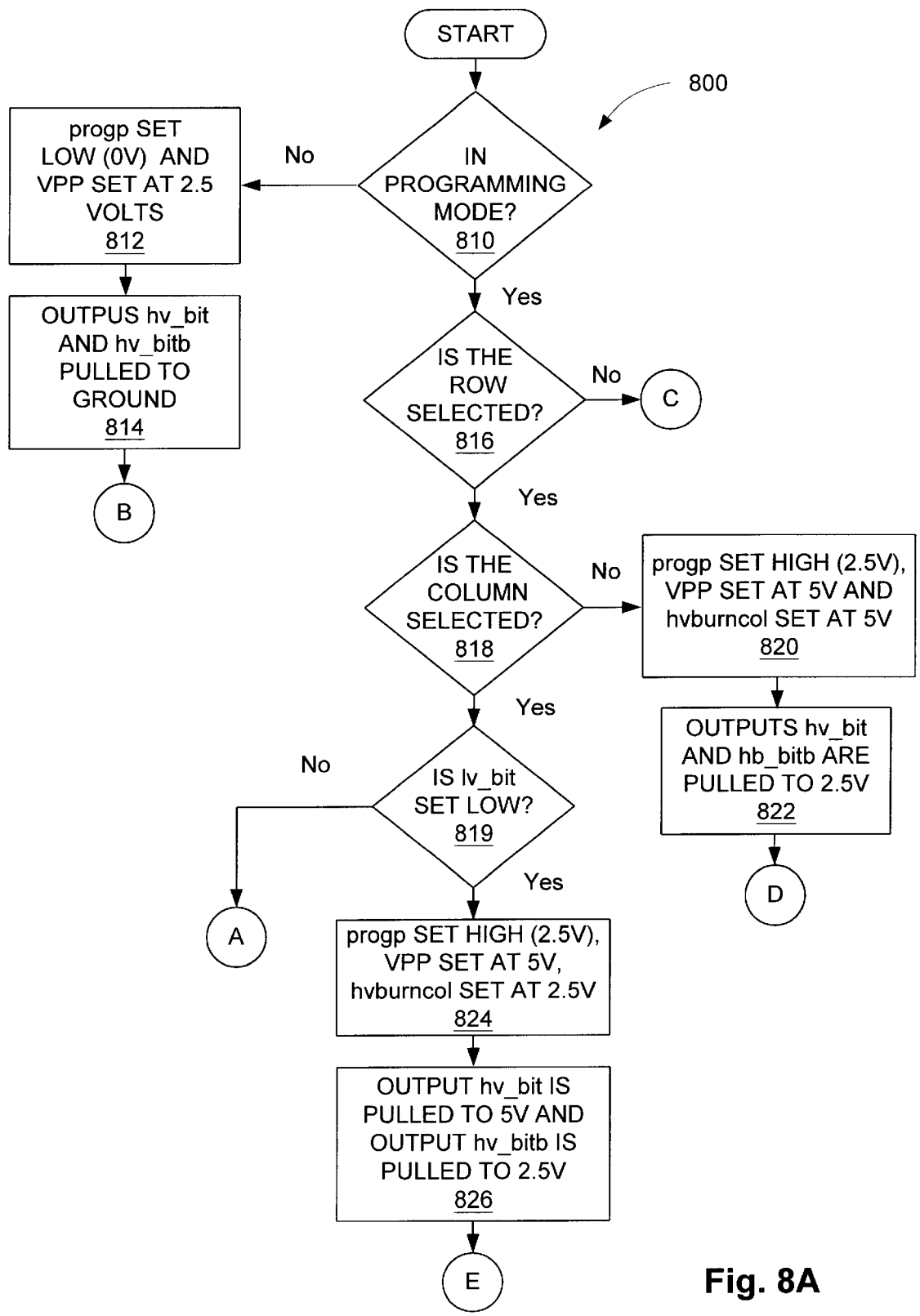
FIGS. 8A and 8B illustrate a detailed flow chart depicting one method of setting a state of the gated fuses in a memory cell using high voltage switch device in accordance with one embodiment of the present invention.
Figure 8B:
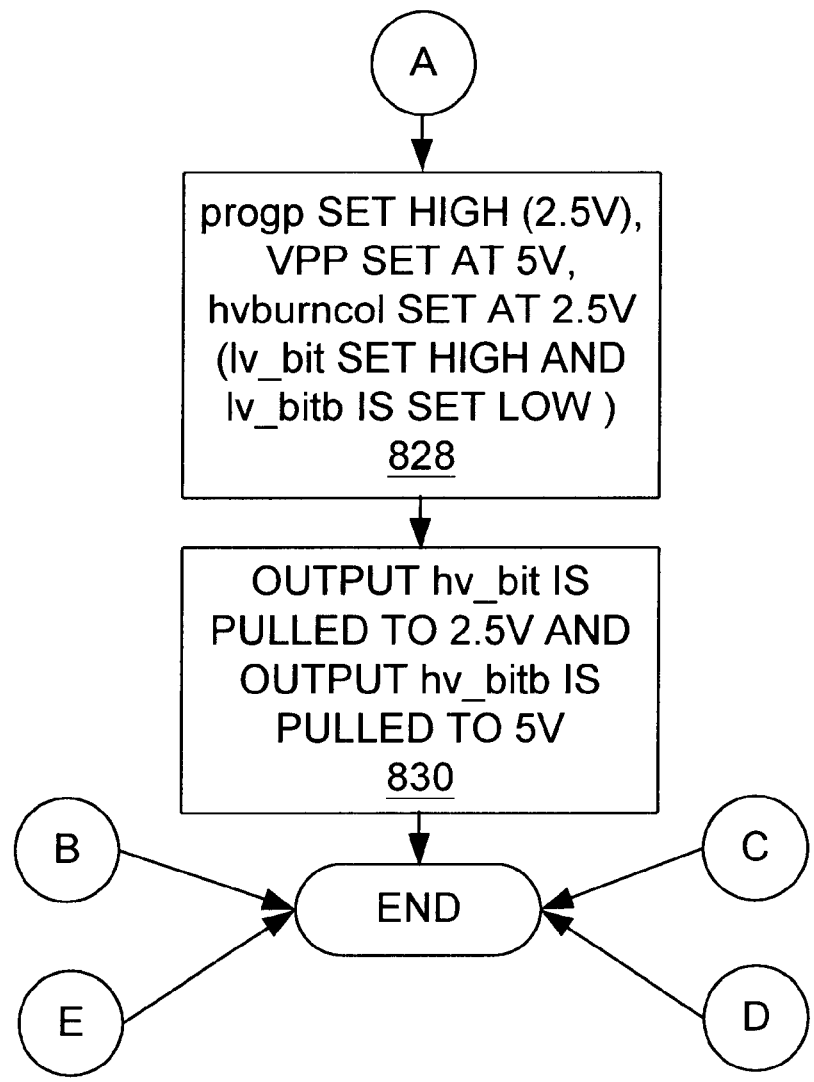

FIGS. 8A and 8B illustrate a more detailed flow chart illustrating one method for setting the state (i.e., blowing the gated fuses) of a memory cell in a memory device in accordance with one embodiment of this present invention. This method, generally designated 800, includes determining if the memory device is in a programming mode as illustrated by diamond 810. If the memory device is not in a programming mode, then progp is set low and VPP is set at about 2.5 volts as illustrated by block 812. Both outputs hv_bit and hv_bitb are pulled to ground as illustrated by block 814.

If the memory device is in a programming mode, then the method determines if one row is selected from a plurality of rows as illustrated by diamond 816. If one row is not selected, the process ends. If however one row is selected, the programming device then determines if a column may be selected as illustrated by diamond 818. If the column is not selected, then progp is set high (about 2.5 volts), VPP is set at about 5 volts and hvburncol is set at about 5 volts as illustrated by block 820. Both outputs hv_bit and hv_bitb are pulled to about 2.5 volts as illustrated by block 822.

If the column is selected, then the selected cell is programmed. The method determines if Iv_bit is set low and Iv_bitb is set high as illustrated by diamond 819. If Iv_bit is set low (Iv_bitb is set high) progp is set high (about 2.5V) VPP is set at about 5 volts, hvburncol is set at 2.5 volts as illustrated by block 824. Outputs hv_bit is pulled to about 5 volts and hv_bitb is pulled to about 2.5 volts as illustrated by a block 826.

Furthermore, progp is set high (about 2.5 volts), VPP is set at about 5 volts, hvburncol is set at about 2.5 volts, Iv_bit is set high and Iv_bitb is set low as illustrated by block 824. Output hv_bit is pulled to about 2.5 volts and hv_bitb is pulled to about 5 volts as illustrated by block 830. This results in the memory cell of the memory device being programmed.

Many modifications and variations of the present invention are possible in light of the above teachings. For example, the present invention may be implemented on substrates comprised of materials other than silicon, such as, for example, gallium, arsenide or sapphire. Thus, it is to be understood that, within the scope of the appended claims, the invention may be practiced otherwise than as described hereinabove.

What is claimed and desired to be secured by Letters Patent is:

1. A memory device comprising:
   a memory cell adapted to store data, said memory cell including at least one thin gate-ox fuse element, said thin gate-ox fuse element having an oxide that is about 2.5 nm thick or less; and
   a voltage switch device coupled to said memory cell and adapted to set a state of said memory cell.

2. The memory device of claim 1, wherein said memory cell includes two thin gate-ox fuse elements.

3. The memory device of claim 1, wherein said memory cell includes a 6T storage element.

4. The memory device of claim 1, wherein said voltage switch device switches in a voltage ranging between about 0 volts and about 5 volts.

5. The memory device of claim 1, wherein said voltage switch device includes at least one level shifter adapted to shift incoming data to a higher voltage.

6. The memory device of claim 1, wherein said voltage switch device includes at least one selecting device adapted to select at least one column in an array.

7. The memory device of claim 1, wherein said voltage switch device includes at least one PFet transistor adapted to switch a high voltage.

8. A one-time programmable memory device comprising:
   at least two memory cells in an array adapted to be programmed using a high voltage, at least one of said memory cells including at least one thin gate-ox fuse element, said thin gate-ox fuse element having an oxide that is about 2.5 nm thick or less; and
   at least one high voltage switch connected to at least one of said memory cells and adapted to switch in a high voltage.

9. The memory device of claim 8, wherein each of said memory cells includes at least one storage element adapted to store data connected to said at least one thin gate-ox fuse element.

10. The memory device of claim 8, wherein said voltage switch device includes at least one selecting device adapted to select at least one column in said array.

11. The memory device of claim 8, wherein said high voltage switch includes at least one level shifter adapted to shift incoming data to a higher voltage.

12. A one time programmable memory device comprising:
- a plurality of memory cells adapted to be programmed using a high voltage, wherein each of said memory cells includes at least one storage element and two thin gate-ox fuses connected to said storage element, at least one of said thin gate-ox fuses having an oxide that is about 2.5 nm thick or less; and
- at least one high voltage switch connected to at least one of said memory cells and adapted to switch in said high voltage.

13. The memory device of claim 12, wherein said memory cells are arranged in a plurality of rows and columns.

14. The memory cell of claim 13, wherein one high voltage switch is attached to a plurality of said memory cells in each column.

15. A method of setting a state of a memory cell using a high voltage switch, said memory cell having at least one thin gate-ox fuse having an oxide that is about 2.5 nm thick or less.

16. The method of claim 15, wherein said high voltage switch switches in a voltage ranging between about 0 volts and about 5 volts.

17. The memory device of claim 8, wherein each of said memory cells includes two thin gate-ox fuse elements, each of said thin gate-ox fuse elements having an oxide that is about 2.5 nm thick or less.

18. A memory cell adapted to store data, said memory cell comprising at least one thin gate-ox fuse element, said thin gate-ox fuse element having an oxide that is about 2.5 nm thick or less.

19. The memory cell of claim 18 comprising a 6T storage element connected to said at least one thin-ox fuse element.

20. A memory device comprising at least one memory cell adapted to store data, said memory cell including at least one thin gate-ox fuse element, said thin gate-ox fuse element having an oxide that is about 2.5 nm thick or less.

21. The memory device of claim 20, wherein said memory cell includes two thin gate-ox fuse elements, wherein at least one of said thin gate-ox fuse elements has an oxide that is about 2.5 nm thick or less.

22. The memory device of claim 20, wherein said memory cell includes at least one 6T storage element.

* * * * *